United States Patent
Kim et al.

(10) Patent No.: US 8,503,251 B2
(45) Date of Patent: Aug. 6, 2013

(54) SEMICONDUCTOR MEMORY DEVICE HAVING PIPE LATCH CIRCUIT FOR STORING OUTPUT DATA DURING READ OPERATION AND METHOD FOR OPERATING THE SAME

(75) Inventors: Hyung-Soo Kim, Gyeonggi-do (KR); Ki-Myung Kyung, Gyeonggi-do (KR); Ic-Su Oh, Gyeonggi-do (KR); Chang-Kun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 201 days.

(21) Appl. No.: 12/881,813

(22) Filed: Sep. 14, 2010

(65) Prior Publication Data

US 2012/0008422 A1    Jan. 12, 2012

(30) Foreign Application Priority Data

Jul. 7, 2010  (KR) .......................... 10-2010-0065338

(51) Int. Cl.
*G11C 7/10*   (2006.01)
(52) U.S. Cl.
USPC .................. 365/189.05; 365/189.11; 365/191; 365/194; 365/230.03
(58) Field of Classification Search
USPC ........... 365/185.11, 189.05, 191, 194, 230.03
See application file for complete search history.

(56) References Cited

U.S. PATENT DOCUMENTS

| | | | | |
|---|---|---|---|---|
| 6,147,905 A | * | 11/2000 | Seino | ........................ 365/185.11 |
| 6,608,797 B1 | | 8/2003 | Parris et al. | |
| 6,778,464 B2 | * | 8/2004 | Chung | ........................ 365/233.1 |
| 7,505,336 B2 | | 3/2009 | Demone | |

FOREIGN PATENT DOCUMENTS

| KR | 1020050082599 | 8/2005 |
|---|---|---|
| KR | 1020070089491 | 8/2007 |

OTHER PUBLICATIONS

Notice of Allowance issued by the Korean Intellectual Property Office on Feb. 25, 2013.

* cited by examiner

*Primary Examiner* — Pho M Luu
*Assistant Examiner* — Thao Bui
(74) *Attorney, Agent, or Firm* — IP & T Group LLP

(57) ABSTRACT

A semiconductor memory device includes a memory bank configured to output stored data in response to a column selection signal, a plurality of data latching units configured to latch the data outputted from the memory bank in response to an input control signal which is generated according to the column selection signal, and output the latched data in response to an output control signal, a time measurement unit configured to measure a time from an activation of the input control signal to an activation of the output control signal and generate a delay control signal, and an activation control unit configured to control an activation time of the column selection signal in response to the delay control signal.

19 Claims, 8 Drawing Sheets

SEMICONDUCTOR MEMORY DEVICE HAVING PIPE LATCH CIRCUIT FOR STORING OUTPUT DATA DURING READ OPERATION AND METHOD FOR OPERATING THE SAME

CROSS-REFERENCE TO RELATED APPLICATIONS

The present application claims priority of Korean Patent Application No. 10-2010-0065338, filed on Jul. 7, 2010, which is incorporated herein by reference in its entirety.

BACKGROUND OF THE INVENTION

Exemplary embodiments of the present invention relate to semiconductor design technology, and more particularly, to a semiconductor memory device including a pipe latch circuit for storing output data during a read operation.

In general, semiconductor memory devices such as Double Data Rate Synchronous DRAM (DDR SDRAM) include a pipe latch circuit configured to receive parallel data stored in a memory bank during a read operation and serially output the received data.

FIG. 1 is a block diagram illustrating a conventional pipe latch circuit.

Referring to FIG. 1, the pipe latch circuit includes first to eighth pipe latching units 110 to 180 configured to sequentially latch parallel data inputted through first to eighth global data lines GIO<1:8> in response to first to eighth pipe input control signals PIN<1:8>, and sequentially output the latched data in response to first to eighth pipe output control signals POUT<1:8>. The number of pipe latching units is often determined by values of a CAS latency (CL), a burst length (BL), and a CAS to CAS delay (tCCD). For example, when the CL, the BL, and, the tCCD have values of 16, 4, and, 4 clocks (tCK), respectively, the number of pipe latching units may be set to five according to Equation 1 expressed below. In Equation 1, N represents the number of pipe latching units.

$$N=(CL+BL)/tCCD \quad (1)$$

Referring to Equation 1, as the CL gradually increases, the number of pipe latching units gradually increases. As the operation frequency of semiconductor memory devices has gradually increased, the CL also has gradually increased. Accordingly, the number of pipe latching units is on the rise. The increase in the number of pipe latching units results in the increase in the circuit size.

FIGS. 2 and 3 are timing diagrams illustrating a circuit operation of a semiconductor memory device related to the pipe latch circuit of FIG. 1. FIGS. 2 and 3 show a case in which the number of pipe latching units is designed according to Equation 1. For convenience of explanation, the following description is focused on the latching operation of the first pipe latching unit 110.

Referring to FIGS. 1 and 2, read commands RD are consecutively applied during a period of n×tCCD. Here, the tCCD represents a time between a read command RD and a next command RD. Meanwhile, the semiconductor memory device internally generates a column selection signal in response to the read command RD, and first data DAT1 stored in the memory bank is transferred to the first to eighth global data lines GIO<1:8> in response to the column selection signal. Subsequently, the first pipe input control signal PIN<1> is activated when a period of tPIN passes after the read command RD is applied, and the first pipe latching unit 110 latches the first data DAT1 transferred through the first to eighth global data lines GIO<1:8> in response to the first pipe input control signal PIN<1>. The latched first data DAT1 is outputted from the first pipe latching unit 110 in response to a first pipe output control signal POUT<1> which is activated during a period of tPOUT. The outputted data is outputted through a data pad DQ. For reference, a case in which the data pad DQ outputs four data D1 corresponding to the first data D1 is taken as an example, which means that the BL is four.

The above-described series of operations may be applied to the second to eighth pipe latching units 120 to 180. That is, the first to eighth pipe latching units 110 to 180 sequentially latch parallel data which are consecutively inputted. Accordingly, after the data is latched in the eighth pipe latching unit 180 serving as the last pipe latching unit, data is latched in the first pipe latching unit 110. FIG. 2 shows such an operation. Second data DAT2 transferred through the first to eighth global data lines GIO<1:8> is latched in the first pipe latching unit 110.

The pipe latch circuit of the semiconductor memory device may perform an abnormal operation by such factors as a process, a voltage, and a temperature, which is illustrated with reference to FIG. 3.

Referring to FIG. 3, the first pipe input control signal PIN<1> is a signal which is activated during the read operation, and the activation time may be changed depending on the process, voltage, and temperature. Comparing FIG. 2 with FIG. 3, it can be seen that the period of tPIN of FIG. 3 becomes shorter than the period of tPIN of FIG. 2.

In this case, the first pipe latching unit 110 latches the second data DAT2, which is inputted after the latched first data DAT1, during a portion of the period in which the first pipe output control signal POUT<1> is activated. As a result, the data pad PQ outputs data D2 corresponding to the second data DAT2. As seen in FIG. 3, when the semiconductor memory device abnormally operates, the data pad DQ may output two data D1 corresponding to the first data DAT1, and subsequently outputs two data D2 corresponding to the second data DAT2.

Meanwhile, such an abnormal operation of the semiconductor memory device may be prevented by increasing the number of pipe latching units. However, when the number of pipe latching units increases, the area of the semiconductor memory device also increases, which may act as a burden in circuit design. Furthermore, the pipe latch circuit is to be provided in each data pad DQ. Considering a recent trend in which the number of data pads gradually increases, the increase in the number of pipe latching units may increase the burden in circuit design.

SUMMARY OF THE INVENTION

An embodiment of the present invention is directed to a semiconductor memory device capable of minimizing/reducing the number of pipe latching units provided in a pipe latch circuit regardless of a CAS latency.

Another embodiment of the present invention is directed to a semiconductor memory device capable of measuring a latching operation time of a pipe latch circuit and reflecting the measured time in an actual latching operation of data.

Another embodiment of the present invention is directed to a semiconductor memory device capable of measuring a latching operation time of a pipe latch circuit and reflecting the measured time in a generation of a column selection signal.

In accordance with an exemplary embodiment of the present invention, a semiconductor memory device includes a memory bank configured to output stored data in response to a column selection signal, a plurality of data latching units configured to latch the data outputted from the memory bank in response to an input control signal which is generated according to the column selection signal, and output the latched data in response to an output control signal, a time measurement unit configured to measure a time from an activation of the input control signal to an activation of the output control signal and generate a delay control signal, and an activation control unit configured to control an activation time of the column selection signal in response to the delay control signal.

In accordance with another exemplary embodiment of the present invention, a method for operating a semiconductor memory device includes measuring activation times of a measurement input control signal corresponding to an input control signal and a measurement output control signal corresponding to an output control signal in a measurement operation mode, controlling an activation time of the input control signal depending on the result of the measuring of the activation times, and latching data stored in a memory bank in response to the input control signal and outputting the latched data in response to the output control signal during a read operation.

In accordance with further exemplary embodiment of the present invention, a semiconductor memory device includes a plurality of data latching units configured to latch data in response to an input control signal and output the latched data in response to an output control signal in a read operation mode, a time measurement unit configured to measure a time from an activation of the input control signal to an activation of the output control signal and generate a delay control signal in a measurement operation mode, and an activation control unit configured to control an activation time of the input control signal in response to the delay control signal and external command signal.

DESCRIPTION OF SPECIFIC EMBODIMENTS

Figure 1:
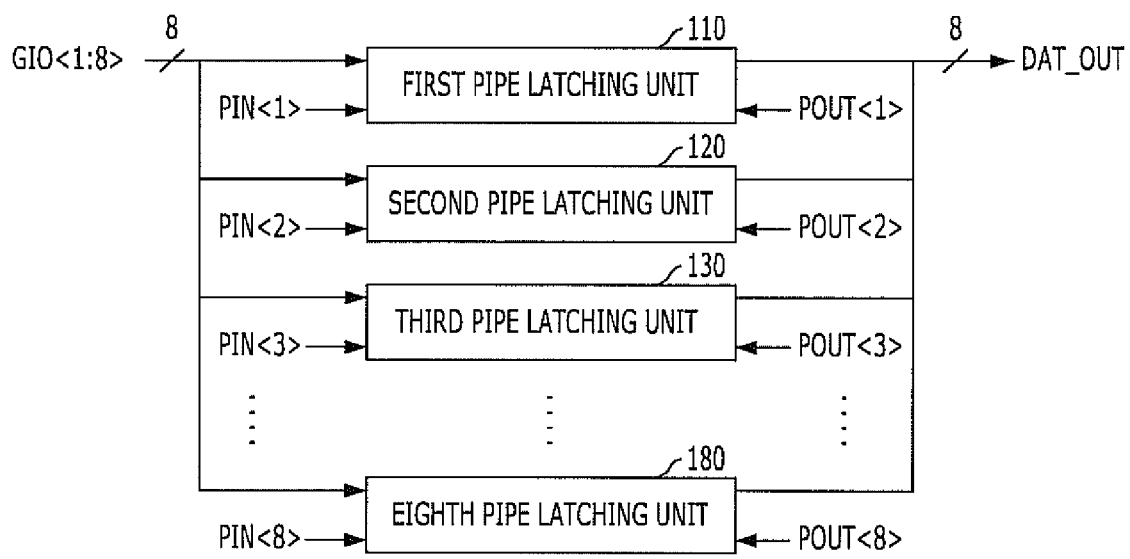
FIG. 1 is a block diagram illustrating a conventional pipe latch circuit.
Figure 2:
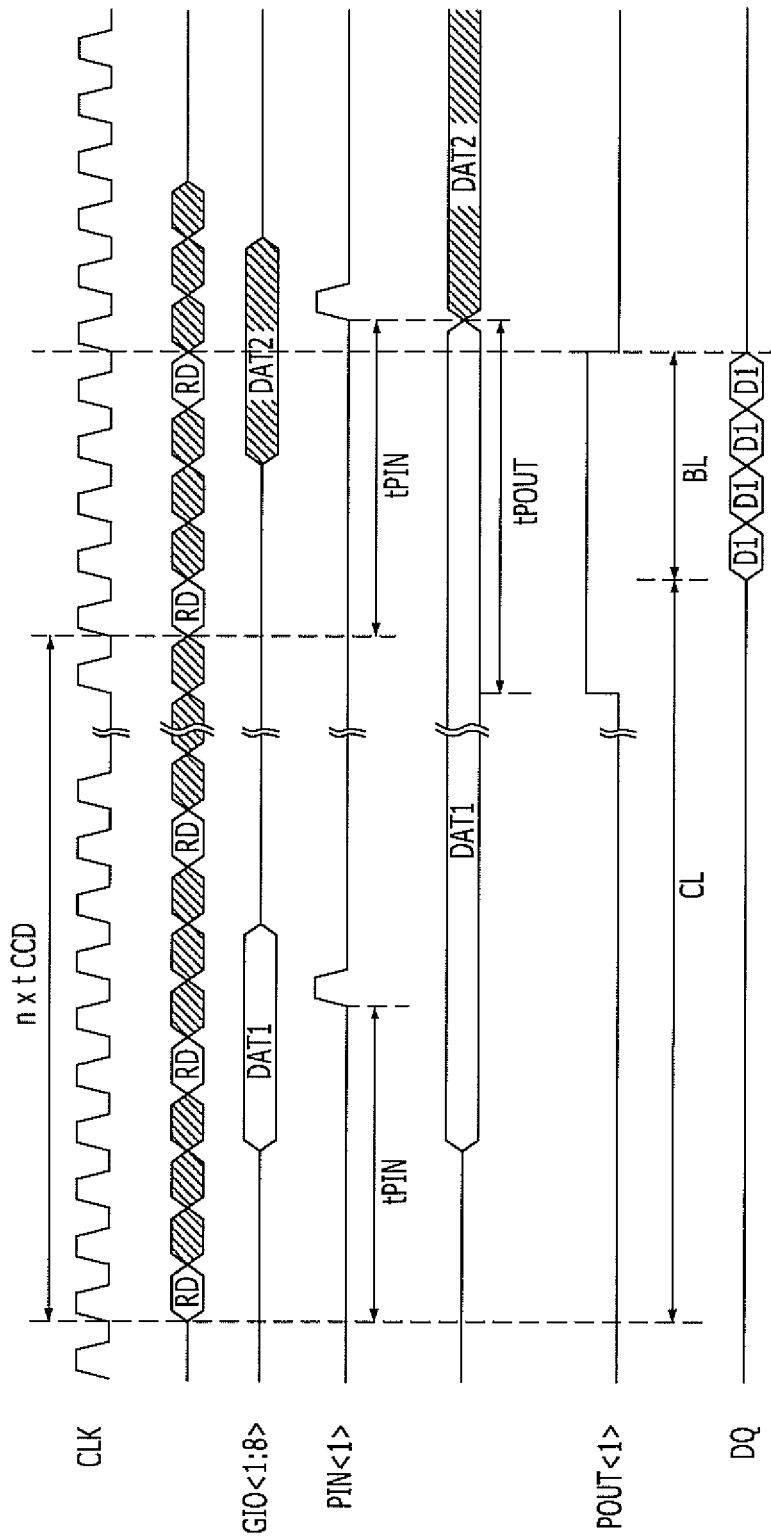
FIGS. 2 and 3 are timing diagrams illustrating a circuit operation of a semiconductor memory device related to the pipe latch circuit of FIG. 1.
Figure 3:
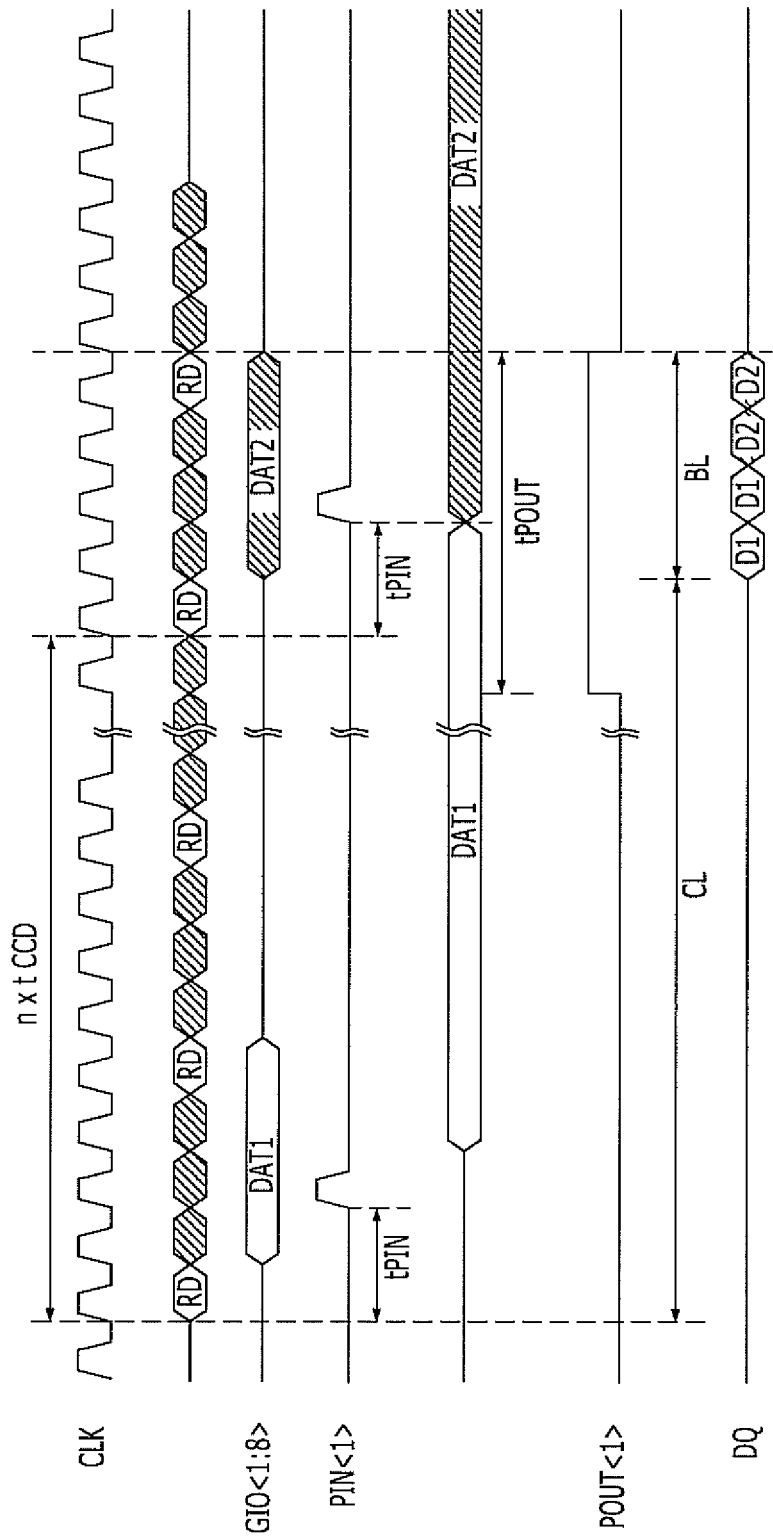

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

A semiconductor memory device in accordance with an embodiment of the present invention may minimize/reduce a time for latching data in a pipe latch circuit. Before the embodiment of the present invention is described, an operation which is to be implemented in the embodiment of the present invention is described with reference to a conventional operation.

Figure 4:
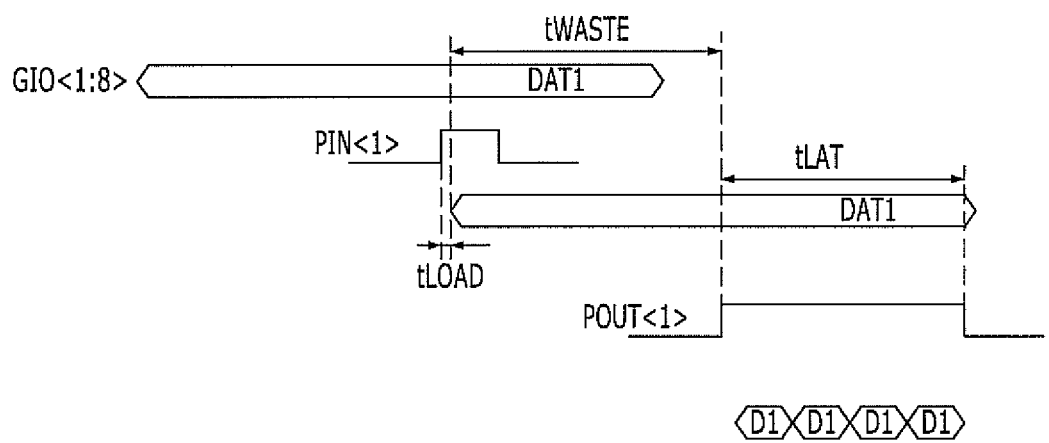
FIG. 4 is a timing diagram illustrating an operation of a conventional pipe latch circuit.

FIG. 4 is a timing diagram illustrating an operation of a conventional pipe latch circuit. For convenience of description, the circuit operation of the first pipe latching unit 110 is taken as an example.

Referring to FIGS. 1 and 4, the data DAT1 transferred through the first to eighth global data lines GIO<1:8> is latched in the first pipe latching unit 110 in response to the first pipe input control signal PIN<1>. Here, a period of tLOAD represents a time taken for latching data in the first pipe latching unit 110 in response to the first pipe input control signal PIN<1>. Meanwhile, the first pipe latching unit 110 outputs the latched data in response to the first pipe output control signal POUT<1>. That is, the data stored in the first pipe latching unit 110 may maintain the latching state at least during a period of tLAT, and a period of tWASTE can be reduced. The semiconductor memory device in accordance with the embodiment of the present invention may control data to be latched in the first pipe latching unit 110 during the period of tLAT by reflecting the period of tWASTE into the circuit operation.

Figure 5:
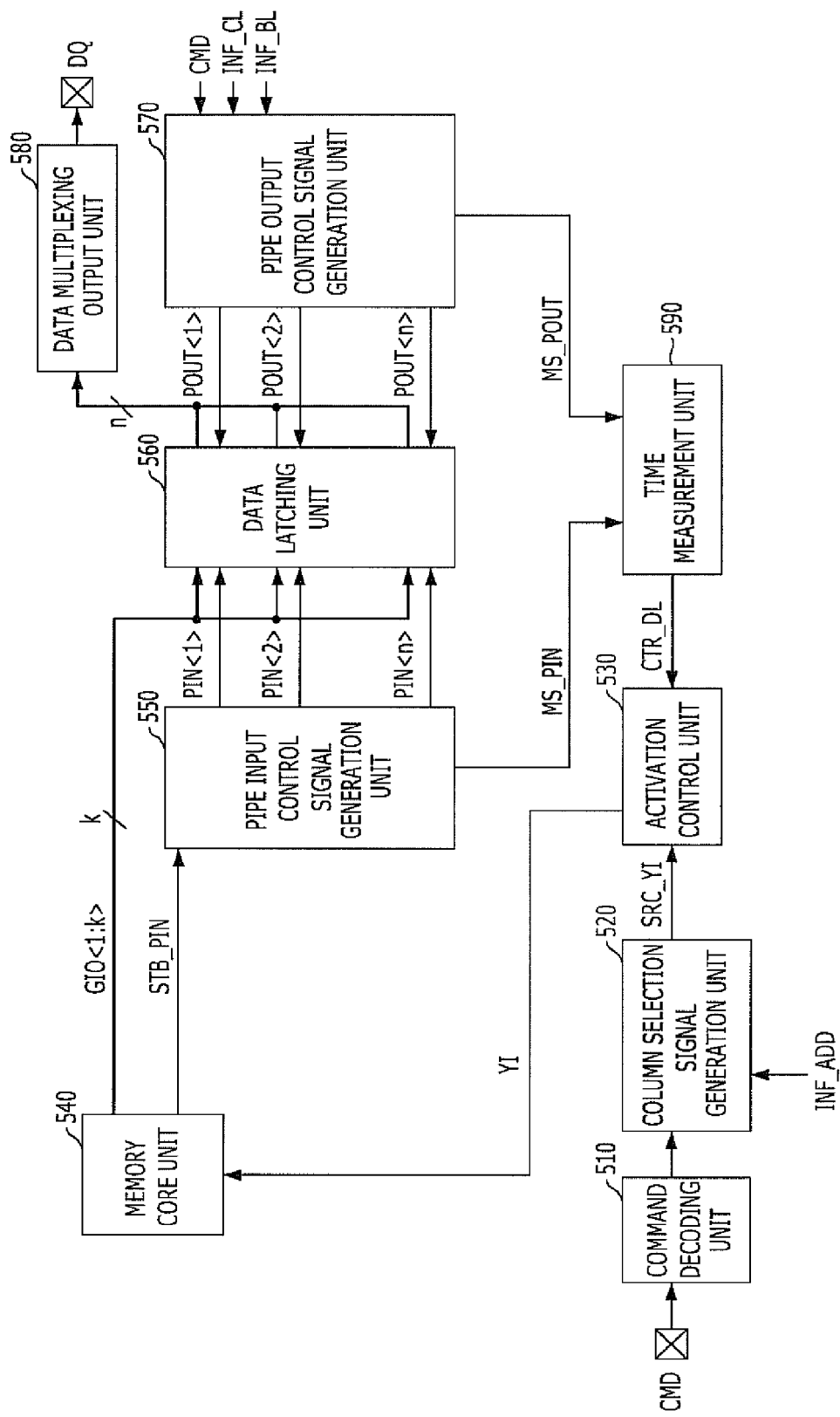
FIG. 5 is a block diagram illustrating the configuration of a semiconductor memory device in accordance with an embodiment of the present invention.

FIG. 5 is a block diagram illustrating the configuration of a semiconductor memory device in accordance with an embodiment of the present invention.

Referring to FIG. 5, the semiconductor memory device includes a command decoding unit 510, a column selection signal generation unit 520, an activation control unit 530, a memory core unit 540, a pipe input control signal generation unit 550, a data latching unit 560, a pipe output control signal generation unit 570, a data multiplexing output unit 580, and a time measurement unit 590.

The command decoding unit 510 is configured to decode an external command signal CMD and generate an activation signal according to a corresponding operation. For reference, the external command signal CMD may include a chip select signal, a row address strobe (RAS) signal, a column address strobe (CAS) signal, a write enable signal and so on. The semiconductor memory device may perform a refresh operation, a read operation, and a write operation, depending on combinations of the signals.

The column selection signal generation unit 520 is configured to reflect address information INF_ADD in the output signal of the command decoding unit 510 and output a source column selection signal SRC_YI. Here, the signal outputted from the column selection signal generation unit 520 becomes a source signal of a column selection signal YI afterwards.

The activation control unit 530 is configured to receive the source column selection signal SRC_YI and output the column selection signal YI. The activation control unit 530 in accordance with the embodiment of the present invention is controlled by a delay control signal CTR_DL which is described below, and determines an activation time of the column selection signal YI according to the control.

The memory core unit 540 includes a memory bank and a circuit configured to generate a pipe input strobe signal STB_PIN. Therefore, the memory core unit 540 outputs data stored in a memory cell corresponding to the address information INF_ADD to a plurality of global data lines GIO<1:k> where k is a natural number, in response to the column selection signal YI. Furthermore, the memory core unit 540 outputs the pipe input strobe signal STB_PIN in response to the column selection signal YI.

The pipe input control signal generation unit 550 is configured to activate a plurality of pipe input control signals PIN<1:n> where n is a natural number, in response to the pipe input strobe signal STB_PIN during a normal operation mode for performing a read operation. The data latching unit 560 is configured to receive and latch data transferred through the plurality of global data lines GIO<1:k> in response to the plurality of pipe input control signals PIN<1:n>. The semiconductor memory device in accordance with the embodiment of the present invention has a measurement operation mode for measuring the period of tWASTE of FIG. 4. During the measurement operation mode, the pipe input control signal generation unit 550 generates a measurement pipe input control signal MS_PIN corresponding to the plurality of pipe input control signals PIN<1:n>. The measurement operation mode is described below.

The pipe output control signal generation unit 570 is configured to activate a plurality of pipe output control signals POUT<1:n> in response to the external command signal CMD, CAS latency information INF_CL, and burst length information INF_BL during the normal operation mode, and the data latching unit 560 outputs the latched data in response to the plurality of pipe output control signals POUT<1:n>. Here, the plurality of pipe output control signals POUT<1:n> are activated at a point of time corresponding to the CAS latency information INF_CL, and has a pulse width corresponding to the burst length information INF_BL. During the measurement operation mode, the pipe output control signal generation unit 570 generates a measurement pipe output control signal MS_POUT corresponding to the plurality of pipe output control signals POUT<1:n>.

The data multiplexing output unit 580 is configured to multiplex the data outputted by the data latching unit 560 and output the multiplexed data to a data pad DQ.

The time measurement unit 590 is configured to generate the delay control signal CTR_DL in response to the measurement pipe input control signal MS_PIN and the measurement pipe output control signal MS_POUT. Here, the delay control signal CTR_DL has information on a time which is from the activation of the measurement pipe input control signal MS_PIN to an activation of the measurement pipe output control signal MS_POUT.

The delay control signal CTR_DL generated in such a manner is inputted to the activation control unit 530, and the activation control unit 530 controls the activation time of the column selection signal YI in response to the delay control signal CTR_DL. The semiconductor memory device in accordance with the embodiment of the present invention may generate the column selection signal YI by delaying the source column selection signal SRC_YI outputted from the column selection signal generation unit 520 by a time corresponding to the delay control signal CTR_DL. Here, the delay control signal CTR_DL may have a variety of values depending on circuits. Hereafter, for convenience of description, a case in which the delay control signal CTR_DL has a code value is taken as an example.

Meanwhile, the measurement pipe input control signal MS_PIN outputted from the pipe input control signal generation unit 550 and the measurement pipe output control signal MS_POUT outputted from the pipe output control signal generation unit 570 are signals which are activated in the measurement operation mode. The measurement operation mode may be performed before the data latching unit 560 performs the latching operation according to the read operation. The time measurement unit 590 performs a measurement operation in response to the pipe input control signal MS_PIN and the measurement pipe output control signal MS_POUT. Here, the measurement operation mode may include a reset operation period or refresh operation period of the semiconductor memory device. In the exemplary embodiment of the present invention, a case in which the measurement operation mode is set by the external command signal CMD has been taken as an example.

Figure 6:
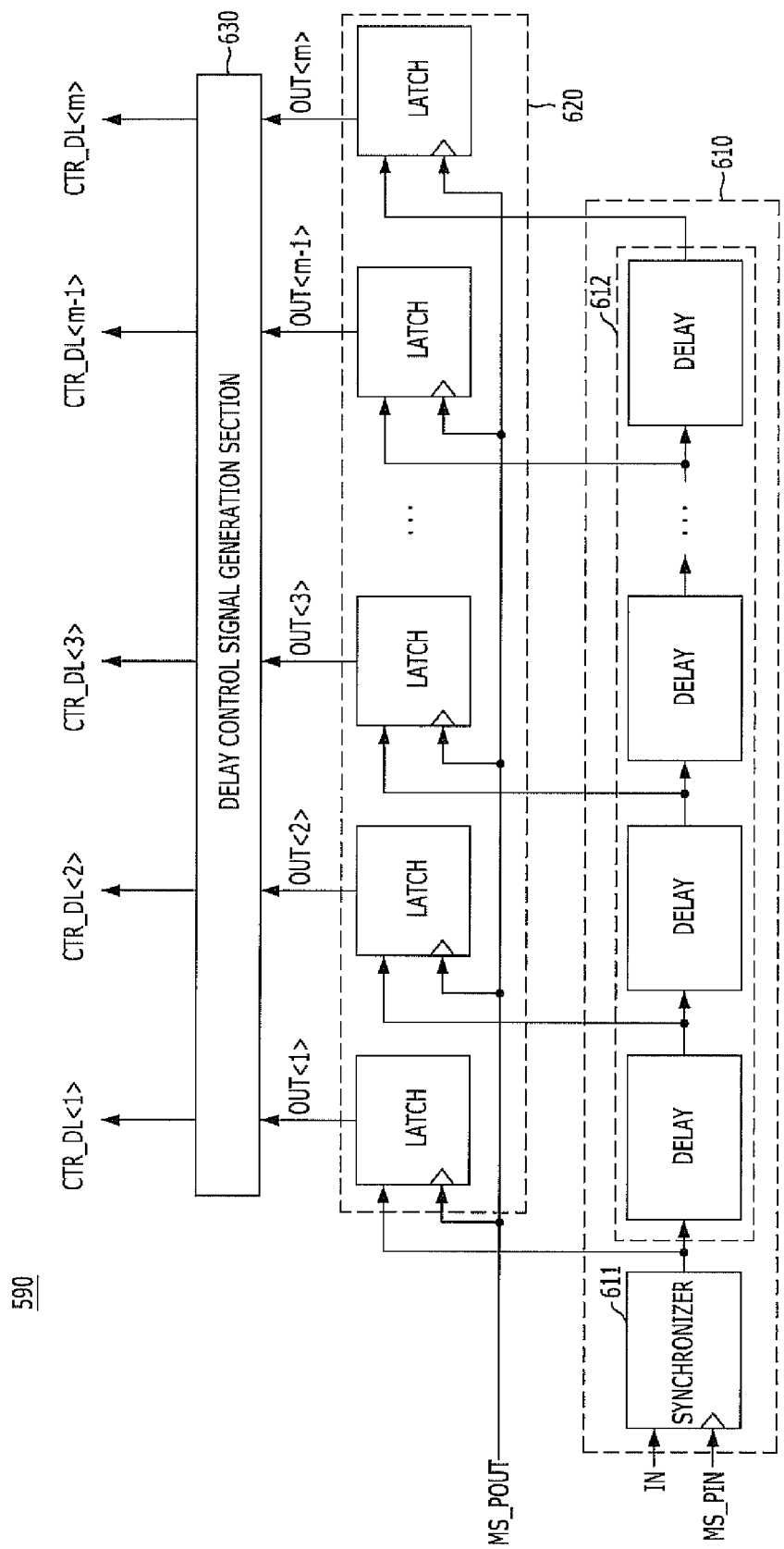
FIG. 6 is a block diagram illustrating the detailed configuration of a time measurement unit of FIG. 5.

FIG. 6 is a block diagram illustrating the detailed configuration of the time measurement unit 590 of FIG. 5.

Referring to FIG. 6, the time measurement unit 590 includes a measurement start section 610, a measurement end section 620, and a delay control signal generation section 630.

The measurement start section 610 is configured to start a measurement operation in response to the measurement pipe input control signal MS_PIN, and includes a synchronizer 611 and a plurality of delays 612. The synchronizer 611 is configured to synchronize an input signal IN having a certain logic level with the measurement pipe input control signal MS_PIN, and output the synchronized signal. The plurality of delays 612 are configured to delay the output signal of the synchronizer 611 by a predetermined time.

The measurement end section 620 is configured to latch the output signal of the measurement start section 610 in response to the measurement pipe output control signal MS_POUT, and includes a plurality of latches configured to receive the output signal of the synchronizer 611 and the output signals of the delays 612, respectively, and latch the signals in response to the measurement pipe output control signal MS_POUT.

Subsequently, the delay control signal generation section 630 is configured to generate a plurality of delay control signals CTR_DL<1> to CTR_DL<m> in response to output signals OUT<1> to OUT<m> of the measurement end section 620. Here, the number of the output signals OUT<1> to OUT<m> and the number of the delay control signals CTR_DL<1> to CTR_DL<m> may differ depending on circuit design.

Hereafter, referring to FIGS. 5 and 6, a circuit operation of the time measurement unit 590 is described. As described above, the measurement pipe input control signal MS_PIN and the measurement pipe output control signal MS_POUT may be activated before the data latching unit 560 perform the latching operation according to the read operation.

First, when the measurement pipe input control signal MS_PIN is activated, the synchronizer 611 synchronizes a logic high input signal IN, for example, with the measurement pipe input control signal MS_PIN, and outputs the synchronized signal. Afterwards, while the signal outputted from the synchronizer 611 passes through the plurality of delays 612, a predetermined time is reflected in the signal.

Meanwhile, when the measurement pipe output control signal MS_POUT is activated, the respective output signals of the measurement start section 610 are latched in the measurement end section 620. Therefore, the output signals OUT<1> to OUT<m> of the measurement end section 620 have a value corresponding to a time during which the input signal IN is delayed until the measurement pipe output control signal MS_POUT is activated after the measurement pipe input control signal MS_PIN is activated. For example, when the measurement pipe output control signal MS_POUT is activated after the measurement pipe input control signal MS_PIN is activated and the input signal IN is outputted to the third delay, the output signals OUT<1> to OUT<3> become logic high, and the other output signals become logic low. When the output signals OUT<1> to OUT<3> are logic high, it means that the time from the activation of the measurement pipe input control signal MS_PIN to that of the measurement pipe output control signal MS_POUT corresponds to total delay times of the first to third delays.

The delay control signal generation section 630 is configured to generate the plurality of delay control signals CTR_DL<1> to CTR_DL<m> in response to the output signals OUT<1> to OUT<m> of the measurement end section 620.

Figure 7:
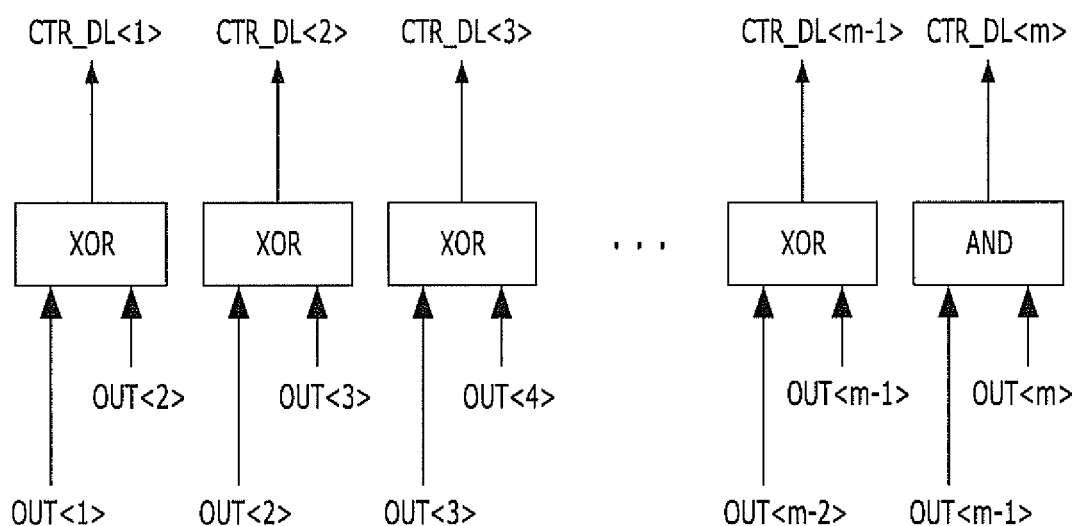
FIG. 7 is a block diagram illustrating a delay control signal generation section of FIG. 6.

FIG. 7 is a block diagram illustrating the delay control signal generation section 630 of FIG. 6.

Referring to FIG. 7, the delay control signal generation section 630 is configured to receive the respective output signals OUT<1> to OUT<m> of the measurement end section 620, performs a logic operation on the received signals, and generate the plurality of delay is control signals CTR_DL<1> to CTR_DL<m>. The delay control signal generation section 630 may include a plurality of logic gates XOR and AND. For example, the output signals OUT<m−1> and OUT<m> are applied to the AND gate AND, and the other output signals are inputted to the XOR gates XOR as shown in FIG. 7.

In such a configuration, when the output signals OUT<1> to OUT<3> among the output signals OUT<1> to OUT<m> of the measurement end section 620 become logic high, the delay control signal CTR_DL<3> becomes logic high, and the other delay control signals become logic low. The semiconductor memory device in accordance with the embodiment of the present invention may control the activation time of the column selection signal YI by using the plurality of delay control signals CTR_DL<1> to CTR_DL<m> generated in such a manner, during the read operation.

Figure 8:
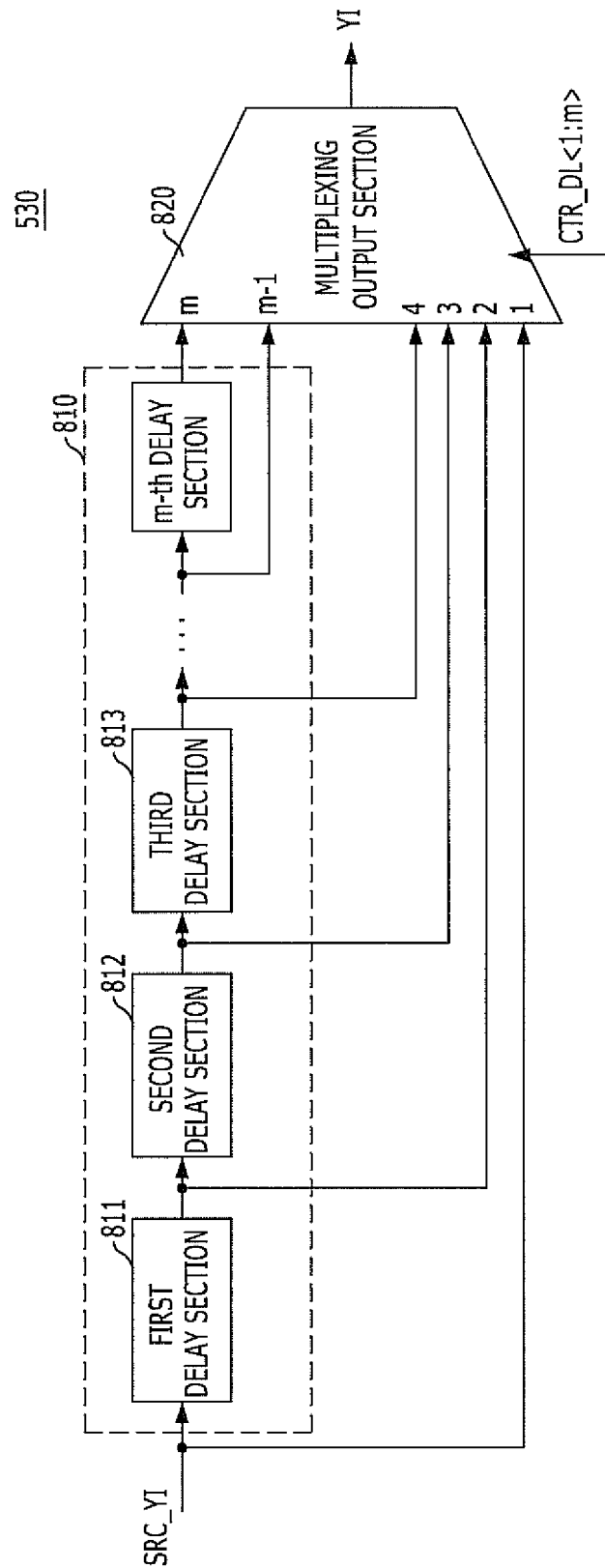
FIG. 8 is a block diagram illustrating an activation control of FIG. 5.

FIG. 8 is a block diagram illustrating the activation control 530 of FIG. 5.

Referring to FIG. 8, the activation control unit 530 includes a plurality of delay sections 810 and a multiplexing output section 820. The plurality of delay sections 810 are configured to delay and output the source column selection signal SRC_YI, and the multiplexing output section 820 is configured to selectively output the output signals of the delay sections 810 in response to the plurality of delay control signals CTR_DL<1> to CTR_DL<m>.

Hereafter, the circuit operation of the activation control unit 530 is described briefly.

The source column selection signal SRC_YI is outputted to the multiplexing output section 820 as differently delayed signals in which different delay amounts are reflected by the plurality of delay sections 810. At this time, the multiplexing output section 820 outputs a signal corresponding to the activated delay control signal among the plurality of delay control signals CTR_DL<1> to CTR_DL<m> as the column selection signal YI. That is, the column selection signal YI is obtained by reflecting a delay amount corresponding to the plurality of delay control signals CTR_DL<1> to CTR_DL<m> in the source column selection signal SRC_YI. As described above, the plurality of delay control signals CTR_DL<1> to CTR_DL<m> have the time information from the activation of the measurement pipe input control signal MS_PIN until that of the measurement pipe output control signal MS_POUT. Therefore, the source column selection signal SRC_YI is delayed by the time from the activation time of the measurement pipe input control signal MS_PIN to that of the measurement pipe output control signal MS_POUT, and outputted as the column selection signal YI.

As described above, the semiconductor memory device in accordance with the embodiment of the present invention may measure the activation times of the measurement pipe input control signal and the measurement pipe input control signal, before the pipe latch circuit performs the latching operation according to the read operation. The semiconductor memory device may also determine a time for an actual data latching operation based on the measured activation times, which are reflected in the activation time of the column selection signal YI. Therefore, the pipe input control signal is also generated by reflecting the time therein in response to the column selection signal YI. As a result, the data may be latched during a minimum/reduced time for an actual operation. Furthermore, when the time for latching the data is minimized/reduced, it means that the number of data latching units corresponding to the pipe latching units may be minimized/reduced, Therefore, a circuit area for latching the data may be reduced.

At this time, the number of data latching unit may be designed regardless of the CAS latency. Conventionally, the number is determined depending on the CAS latency. In the semiconductor memory device in accordance with the embodiment of the present invention, however, the number may be determined by considering only BL, which may provide an environment in which the number of data latching units is reduced.

In accordance with the embodiment of the present invention, the number of pipe latching units is reduced to minimize/reduce the corresponding area of the semiconductor memory device. Therefore, the chip size of the semiconductor memory device may also be reduced.

Furthermore, the data latching time of the pipe latching circuit is minimized/reduced. Therefore, the circuit operation of the semiconductor memory device may be controlled optimally.

While the present invention has been described with respect to the specific embodiments, it will be apparent to those skilled in the art that various changes and modifications may be made without departing from the spirit and scope of the invention as defined in the following claims.

Furthermore, the time measurement unit 590 of the semiconductor memory device in accordance with the embodiment of the present invention may be designed in various manners. For example, the time measurement unit 590 may be configured to perform a counting operation in response to the activation time of the measurement input control signal MS_PIN and output a counted value in response to the activation time of the measurement output control signal MS_POUT.

The positions and types of the logic gates and transistors described in the above embodiment may be differently implemented depending on the polarities of input signals.

What is claimed is:

1. A semiconductor memory device comprising:
   a memory bank configured to output stored data in response to a column selection signal;
   a plurality of data latching units configured to latch the data outputted from the memory bank in response to an input control signal which is generated according to the column selection signal, and output the latched data in response to an output control signal;

a time measurement unit configured to measure a time from an activation of the input control signal to an activation of the output control signal and generate a delay control signal; and an activation control unit configured to control an activation time of the column selection signal in response to the delay control signal.

2. The semiconductor memory device of claim 1, wherein further comprising:

an input control signal generation unit configured to generate the input control signal to the data latching units, and provide a measurement input control signal corresponding to the input control signal to the time measurement unit during a measurement operation mode; and an output control signal generation unit configured to generate the output control signal to the data latching units, and provide a measurement output control signal corresponding to the output control signal to the time measurement unit during the measurement operation mode.

3. The semiconductor memory device of claim 2, wherein the time measurement unit comprises:

a measurement start section configured to delay an input signal in response to the measurement input control signal;

a measurement end section configured to latch an output signal of the measurement start section in response to the measurement output control signal; and a delay control signal generation section configured to generate the delay control signal in response to an output signal of the measurement end section.

4. The semiconductor memory device of claim 2, wherein a period of the measurement operation mode comprises a reset operation period or refresh operation period.

5. The semiconductor memory device of claim 3, wherein the measurement start section comprises:

a synchronizer configured to synchronize the input signal with the measurement input control signal and output an synchronized signal; and a delay configured to delay the synchronized signal by a predetermined time and output the delayed signal.

6. The semiconductor memory device of claim 1, further comprising:

a decoding unit configured to decode an external command signal; and a signal generation unit configured to generate a source signal in response to an output signal of the decoding unit and address information, and provide the source signal to the activation control unit as a source of the column selection signal.

7. The semiconductor memory device of claim 6, wherein the activation control unit delays the source signal by a time corresponding to the delay control signal and generates the column selection signal.

8. The semiconductor memory device of claim 6, wherein the activation control unit comprises:

a plurality of delay sections configured to delay the source signal; and a multiplexing section configured to selectively output signals of the delay sections in response to the delay control signal.

9. The semiconductor memory device of claim 1, wherein the time measurement unit is activated before the plurality of data latching units perform a latching operation according to a read operation.

10. The semiconductor memory device of claim 1, wherein the delay control signal has a code value corresponding to the activation times of the input control signal and the output control signal.

11. The semiconductor memory device of claim 1, wherein the number of the data latching units corresponds to a burst length (BL).

12. A method for operating a semiconductor memory device, comprising:

measuring activation times of a measurement input control signal corresponding to an input control signal and a measurement output control signal corresponding to an output control signal in a measurement operation mode;

controlling an activation time of the input control signal depending on the result of the measuring of the activation times; and latching data stored in a memory bank in response to the input control signal and outputting the latched data in response to the output control signal during a read operation, wherein the measuring of the activation times comprises:

delaying an input signal in response to the measurement input control signal; and outputting an delayed input signal as a delay control signal in response to the measurement output control signal.

13. The method of claim 12, wherein, the measuring of the activation times comprises measuring a time from an activation of the measurement input control signal to an activation of the measurement output control signal.

14. The method of claim 12, wherein the input control signal is activated in response to a column selection signal which is activated during the read operation, and the measurement input control signal is activated in response to a column selection signal which is activated during the measurement operation mode.

15. The method of claim 14, further comprising generating a source signal of the column selection signal in response to an external command signal.

16. The method of claim 15, wherein the controlling of the activation time of the input control signal comprises:

delaying the source signal by a time corresponding to the delay control signal, and generating the column selection signal; and generating the input control signal in response to the column selection signal.

17. The method of claim 12, wherein the read operation and the measurement operation mode are defined according to an external command signal.

18. The method of claim 17, wherein the measurement operation mode is performed before the read operation.

19. A semiconductor memory device, comprises:

a plurality of data latching units configured to latch data in response to an input control signal and output the latched data in response to an output control signal;

a time measurement unit configured to measure a time from an activation of the input control signal to an activation of the output control signal and generate a delay control signal; and an activation control unit configured to control an activation time of the input control signal in response to the delay control signal and external command signal.

* * * * *